United States Patent
Sun et al.

(10) Patent No.: US 8,735,269 B1
(45) Date of Patent: May 27, 2014

(54) METHOD FOR FORMING SEMICONDUCTOR STRUCTURE HAVING TIN LAYER

(71) Applicant: United Microelectronics Corp., Hsin-Chu (TW)

(72) Inventors: Chi-Yuan Sun, Yunlin County (TW); Chien-Hao Chen, Yunlin County (TW); Hsin-Fu Huang, Tainan (TW); Min-Chuan Tsai, New Taipei (TW); Wei-Yu Chen, Tainan (TW); Chi-Mao Hsu, Tainan (TW); Tsun-Min Cheng, Changhua County (TW); Chin-Fu Lin, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/741,402

(22) Filed: Jan. 15, 2013

(51) Int. Cl.
*H01L 21/28* (2006.01)

(52) U.S. Cl.
USPC .......................................... 438/592

(58) Field of Classification Search
None
See application file for complete search history.

(56) References Cited

U.S. PATENT DOCUMENTS

| | | |
|---|---|---|
| 5,892,282 A | 4/1999 | Hong |
| 6,033,963 A | 3/2000 | Huang |
| 6,066,533 A | 5/2000 | Yu |
| 6,096,659 A | 8/2000 | Gardner |
| 6,177,303 B1 | 1/2001 | Schmitz |
| 6,271,592 B1 | 8/2001 | Kim |
| 6,303,418 B1 | 10/2001 | Cha |
| 6,458,684 B1 | 10/2002 | Guo |
| 6,492,217 B1 | 12/2002 | Bai |
| 6,552,377 B1 | 4/2003 | Yu |
| 6,573,134 B2 | 6/2003 | Ma |
| 6,653,698 B2 | 11/2003 | Lee et al. |
| 6,696,345 B2 | 2/2004 | Chau |
| 6,790,719 B1 | 9/2004 | Adetutu |
| 6,794,234 B2 | 9/2004 | Polishchuk |
| 6,858,483 B2 | 2/2005 | Doczy |
| 6,902,969 B2 | 6/2005 | Adetutu |
| 6,921,711 B2 | 7/2005 | Cabral, Jr. |
| 6,953,719 B2 | 10/2005 | Doczy |
| 6,960,416 B2 | 11/2005 | Mui |
| 6,967,131 B2 | 11/2005 | Saenger |
| 6,972,225 B2 | 12/2005 | Doczy |
| 7,029,966 B2 | 4/2006 | Amos |
| 7,030,430 B2 | 4/2006 | Doczy |
| 7,056,794 B2 | 6/2006 | Ku |
| 7,064,050 B2 | 6/2006 | Cabral, Jr. |
| 7,064,066 B1 | 6/2006 | Metz |
| 7,074,664 B1 | 7/2006 | White |
| 7,074,680 B2 | 7/2006 | Doczy |
| 7,109,079 B2 | 9/2006 | Schaeffer, III |
| 7,112,851 B2 | 9/2006 | Saenger |
| 7,126,199 B2 | 10/2006 | Doczy |

(Continued)

*Primary Examiner* — Charles Garber
*Assistant Examiner* — Stanetta Isaac
(74) *Attorney, Agent, or Firm* — Winston Hsu; Scott Margo

(57) ABSTRACT

The method for forming a semiconductor structure includes first providing a substrate. Then, a TiN layer is formed on the substrate at a rate between 0.3 and 0.8 angstrom/second. Finally, a poly-silicon layer is formed directly on the TiN layer. Since the TiN in the barrier layer is formed at a low rate so as to obtain a good quality, the defects in the TiN layer or the defects on the above layer, such as gate dummy layer or gate cap layer, can be avoided.

14 Claims, 4 Drawing Sheets

(56) References Cited

U.S. PATENT DOCUMENTS

| | | |
|---|---|---|
| 7,144,783 B2 | 12/2006 | Datta |
| 7,148,548 B2 | 12/2006 | Doczy |
| 7,153,734 B2 | 12/2006 | Brask |
| 7,153,784 B2 | 12/2006 | Brask |
| 7,157,378 B2 | 1/2007 | Brask |
| 7,176,090 B2 | 2/2007 | Brask |
| 7,183,184 B2 | 2/2007 | Doczy |
| 7,186,605 B2 | 3/2007 | Cheng |
| 7,193,893 B2 | 3/2007 | Forbes |
| 7,208,361 B2 | 4/2007 | Shah |
| 7,208,366 B2 | 4/2007 | Tsai |
| 7,217,611 B2 | 5/2007 | Kavalieros |
| 7,220,635 B2 | 5/2007 | Brask |
| 7,316,949 B2 | 1/2008 | Doczy |
| 7,317,231 B2 | 1/2008 | Metz |
| 7,326,610 B2 | 2/2008 | Amos |
| 7,351,663 B1 * | 4/2008 | Kabansky et al. ............ 438/706 |
| 7,355,281 B2 | 4/2008 | Brask |
| 7,381,619 B2 | 6/2008 | Wang |
| 7,390,709 B2 | 6/2008 | Doczy |
| 7,407,876 B2 | 8/2008 | Ishizaka |
| 7,488,656 B2 | 2/2009 | Cartier |
| 7,556,998 B2 | 7/2009 | Park |
| 7,700,479 B2 | 4/2010 | Huang |
| 7,785,958 B2 | 8/2010 | Doczy |
| 2002/0048937 A1 * | 4/2002 | Selsley ........................ 438/643 |
| 2002/0127888 A1 | 9/2002 | Cho |
| 2005/0095763 A1 | 5/2005 | Samavedam |
| 2005/0202659 A1 | 9/2005 | Li |
| 2005/0275035 A1 | 12/2005 | Mathew |
| 2006/0024953 A1 | 2/2006 | Papa Rao |
| 2006/0040482 A1 | 2/2006 | Yang |
| 2006/0054943 A1 | 3/2006 | Li |
| 2007/0037335 A1 | 2/2007 | Chambers |
| 2007/0082445 A1 | 4/2007 | Yang |
| 2007/0138559 A1 | 6/2007 | Bohr |
| 2007/0145591 A1 | 6/2007 | Yano |
| 2007/0148838 A1 | 6/2007 | Doris |
| 2007/0210354 A1 | 9/2007 | Nabatame |
| 2007/0259519 A1 | 11/2007 | Yang |
| 2007/0262451 A1 | 11/2007 | Rachmady |
| 2007/0272123 A1 | 11/2007 | Kennedy |
| 2008/0076216 A1 | 3/2008 | Pae |
| 2008/0224235 A1 | 9/2008 | Lavoie |
| 2008/0318371 A1 | 12/2008 | Lin |
| 2009/0039433 A1 | 2/2009 | Yang |
| 2009/0057769 A1 | 3/2009 | Wei |
| 2009/0057787 A1 | 3/2009 | Matsuki |
| 2009/0166769 A1 | 7/2009 | Metz |
| 2009/0186458 A1 | 7/2009 | Yu |
| 2009/0273087 A1 * | 11/2009 | French et al. ................ 257/761 |
| 2010/0044783 A1 | 2/2010 | Chuang |
| 2010/0052066 A1 | 3/2010 | Yu |
| 2010/0052074 A1 | 3/2010 | Lin |
| 2010/0065926 A1 | 3/2010 | Yeh |
| 2010/0068877 A1 | 3/2010 | Yeh |
| 2010/0081262 A1 | 4/2010 | Lim |
| 2010/0087055 A1 | 4/2010 | Lai |
| 2010/0124818 A1 | 5/2010 | Lee |
| 2010/0178772 A1 * | 7/2010 | Lin et al. .................... 438/703 |
| 2010/0244141 A1 | 9/2010 | Beyer |
| 2011/0195549 A1 * | 8/2011 | Chuang et al. ............ 438/216 |
| 2011/0254060 A1 * | 10/2011 | Yang et al. .................... 257/288 |

* cited by examiner

METHOD FOR FORMING SEMICONDUCTOR STRUCTURE HAVING TIN LAYER

BACKGROUND OF THE INVENTION

1. Field of the Invention

The present invention relates to a method for forming a semiconductor structure, and more particularly, to a method for forming a semiconductor structure having a MOS with a TiN layer as the barrier layer.

2. Description of the Prior Art

In modern society, the micro-processor systems comprising integrated circuits (IC) are ubiquitous devices, which are utilized in diverse fields such as automatic control electronics, mobile communication devices and personal computers. With the development of technologies and the increasingly imaginative applications of the electrical products, the IC devices become smaller, more delicate and more diversified.

Metal-oxide-semiconductors (MOS) transistors are usually used in the integrated circuits. Conventionally, a polysilicon layer is used as the gate material of the MOS. However, with a trend toward scaling down the size of semiconductor devices, conventional poly-silicon gates face problems such as inferior performances due to boron penetration and unavoidable depletion effect, which increases the equivalent thickness of the gate dielectric layer, reduces the gate capacitance, and worsens a driving force of the devices. Therefore, metals with a work function that are suitable for use as the high-k gate dielectric layer, are used to replace the conventional poly-silicon gates to serve as the control electrode.

However, some issues still need to be overcome in the current metal gate MOS fabrication method.

SUMMARY OF THE INVENTION

It is one objective of the present invention to form a semiconductor structure such as a metal gate MOS, wherein the elements in the metal gate MOS are free from whisker defects.

According to one embodiment of the present invention, the method for forming a semiconductor structure primarily comprises providing a substrate. Then, a TiN layer is formed on the substrate at a rate between 0.3 to 0.8 angstrom/second. Lastly, a poly-silicon layer is formed directly on the TiN layer.

Since the TiN in the barrier layer is formed at a low rate to obtain a good quality, the problems, such as whisker defects in the TiN layer or the defects on the above layer, like a gate dummy layer or gate cap layer, can be avoided.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
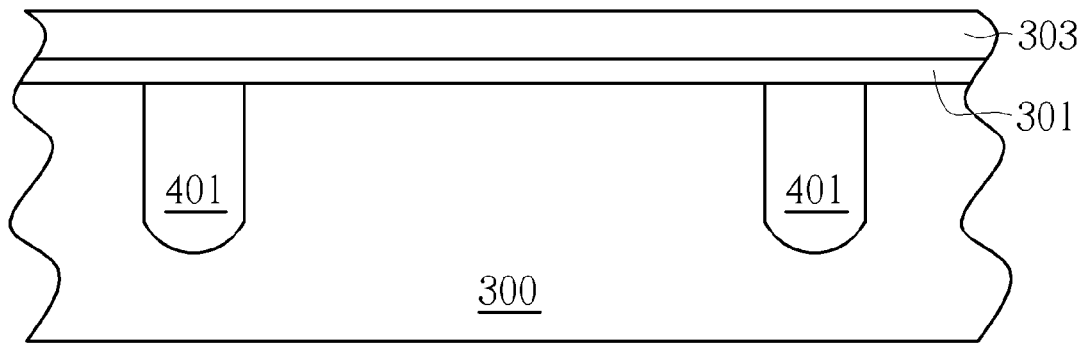
FIG. 1 to FIG. 8 illustrate schematic diagrams for forming a semiconductor structure according to one embodiment of the present invention.

Please refer to FIG. 1 to FIG. 8, which illustrate schematic diagrams of forming a semiconductor structure according to one embodiment of the present invention. As shown in FIG. 1, a substrate 300 is provided. The substrate 300 can be a silicon substrate, an epitaxial silicon substrate, a silicon-germanium substrate, a silicon carbide substrate or a silicon-on-insulator (SOI) substrate, but not limited thereto. A plurality of shallow trench isolations (STI) 401 is formed in the substrate 300, thereby defining at least an active region 402 encompassed by the STI 401. Then, an interface layer 301 and a dielectric layer 303 are sequentially formed on the substrate 300 through a deposition process, such as a chemical vapor deposition (CVD) or a physical vapor deposition (PVD). The interface layer 301 can increase the adhesive ability of the above dielectric layer 303. Said interface layer 301 can be omitted in another embodiment, however. The material of the interface layer 301 may be silicon dioxide or nitridation silicon dioxide. In another embodiment, the interface layer 301 can be formed on the substrate 300 through an oxidation process. The dielectric layer 303 can be a single-layered or a multi-layered structure and the material thereof can be $SiO_2$ or a high-k dielectric material, such as a rare earth metal oxide for example. The high-k dielectric material has a dielectric constant substantially greater than 20. In one embodiment, the high-k dielectric material includes hafnium oxide ($HfO_2$), hafnium silicon oxide (HfSiO), hafnium silicon oxynitride (HfSiON), aluminum oxide (AlO), lanthanum oxide ($La_2O_3$), lanthanum aluminum oxide (LaAlO), tantalum oxide, $Ta_2O_3$, zirconium oxide ($ZrO_2$), zirconium silicon oxide (ZrSiO), hafnium zirconium oxide (HfZrO), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto.

Figure 2:
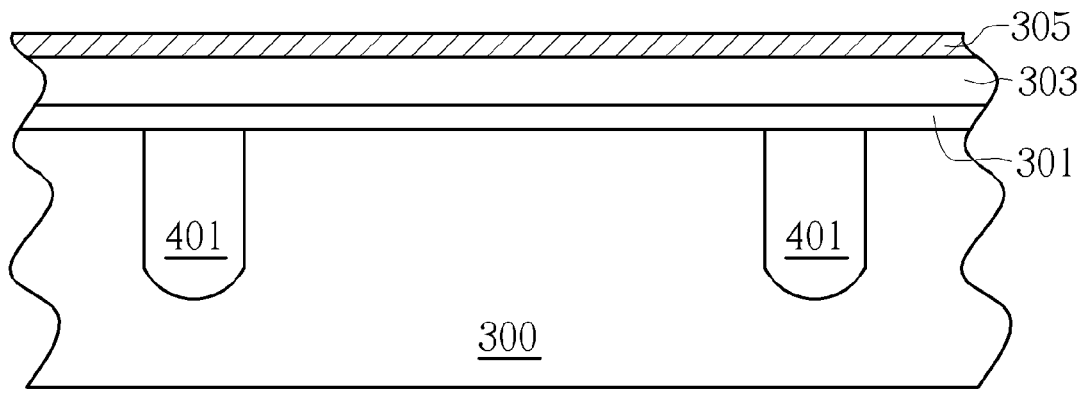

As shown in FIG. 2, a barrier layer 305, such as a TiN layer, is formed on the dielectric layer 303 through a CVD process or a PVD process for example. In another embodiment, there can be other barrier layers containing TaN or other suitable materials formed between the barrier layer 305 and the dielectric layer 303. In order to improve the quality of the TiN in the barrier layer 305, the method for forming the barrier layer 305 in the present invention is to carry out the process at a relatively low rate. In one embodiment, the barrier layer 305 is formed at a rate between 0.3 and 0.8 angstrom/second, preferably between 0.4 and 0.6 angstrom/second. In comparison with conventional arts that forms TiN layers at a rate up to 1.5 angstrom/second, the present invention proposes a three times lower rate than that of the conventional arts, so as to obtain a more compact and smooth barrier layer 305. In one embodiment, the lower forming rate is achieved by adjusting a DC/RF power. For example, when the barrier layer 305 of TiN is formed by a PVD process by supplying 0/60 sccm of $Ar/N_2$ gas, the PVD process is carried out with a DC/RF power of 500/600 W (compared to 2000/800 W in conventional arts). In another embodiment, when the barrier layer 305 is formed by a PVD process by supplying 20/40 sccm of $Ar/N_2$ gas, the PVD process is carried out with a DC/RF power of 500/600 W (compared to 1000/800 W in conventional arts). It is understood that the lower forming rate of TiN layer 305 is not limited to above-mentioned process but can be achieved by other means, such as performing the PVD layer at a lower temperature. The principle is that the barrier layer 305 of TiN should be formed at a rate between 0.3 to 0.8 angstrom/second.

Figure 3:
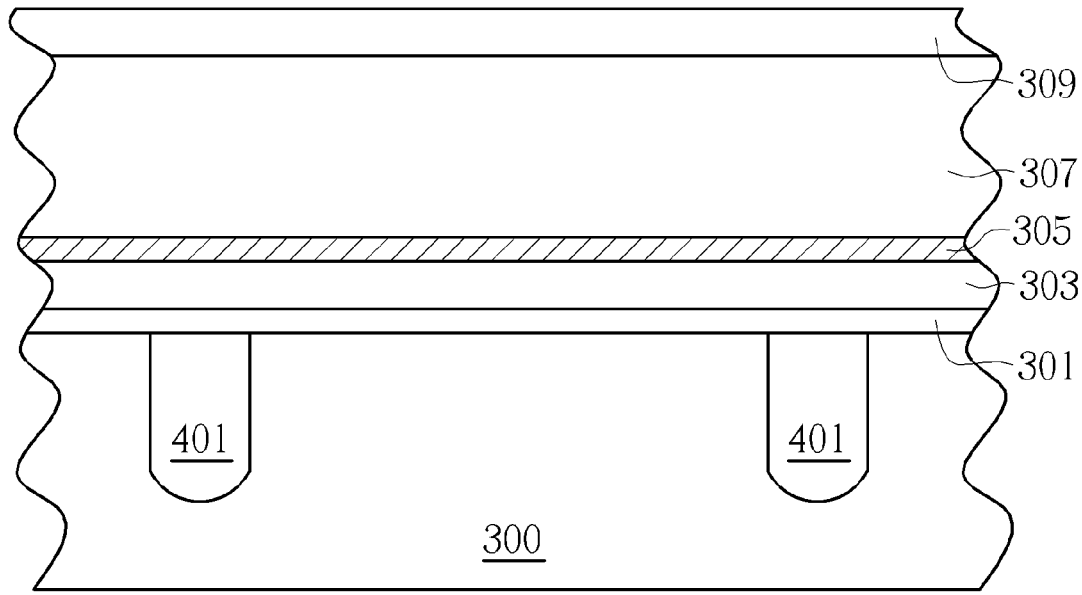

As shown in FIG. 3, a dummy layer 307, such as a poly-silicon layer, is formed directly on the barrier layer 305. It is noted that in conventional arts, many defects, such as whisker defect or fallen-on particles, tend to occur on the dummy layer 307 that contains poly-silicon. A TiN layer formed by a PVD process may contain Ti-rich portions randomly distributed on the substrate if the deposition condition is not well-controlled. The poly-silicon grows quickly on the Ti-rich portions than the rest portions of the substrate, which results in whisker defects. The defects are mainly attributed to the roughness of the TiN layer and result from the poor interface between the TiN in the barrier layer 305 and the poly-silicon in the dummy layer 307. Accordingly, since the TiN in the barrier layer 305 in the present invention is fabricated at a relatively lower rate, a smooth and compact surface can be successfully formed for the poly-silicon to be formed thereon and the whisker defects of the poly-silicon in the dummy layer 307 in conventional arts can be avoided. In practice, the amount of the defects decreases from 102,143/per wafer to 314/per wafer, providing strong evidence that the method provided in the present invention can improve the quality of the barrier layer 305 and thus avoid the defects. In one embodiment, the dummy layer 307 can be formed by a suitable deposition process such as a CVD process, but is not limited thereto. In another embodiment, the dummy layer 307 can be a multi-layered structure and include other suitable materials such as an amorphous silicon layer or a germanium layer. Preferably, the portion of the poly-silicon in the dummy layer 307 directly contacts the TiN in the barrier layer 305. Then, a cap layer 309 such as a SiN layer is formed on the dummy layer 307.

Figure 4:
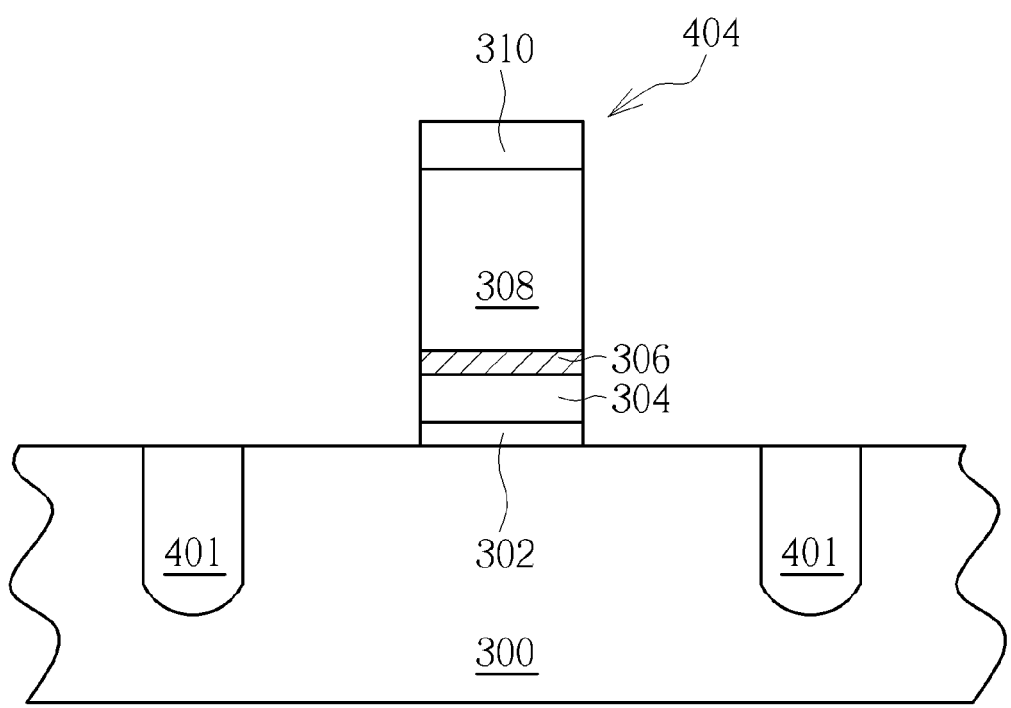

As shown in FIG. 4, the interface layer 301, the dielectric layer 303, the barrier layer 305, the dummy layer 307 and the cap layer 309 are patterned through one or a plurality of photo-etching processes to form a gate stack structure 404. The gate stack structure 404 has a gate interface layer 302, a gate dielectric layer 304, a gate barrier layer 306, a gate dummy layer 308 and a gate cap layer 310.

Figure 5:
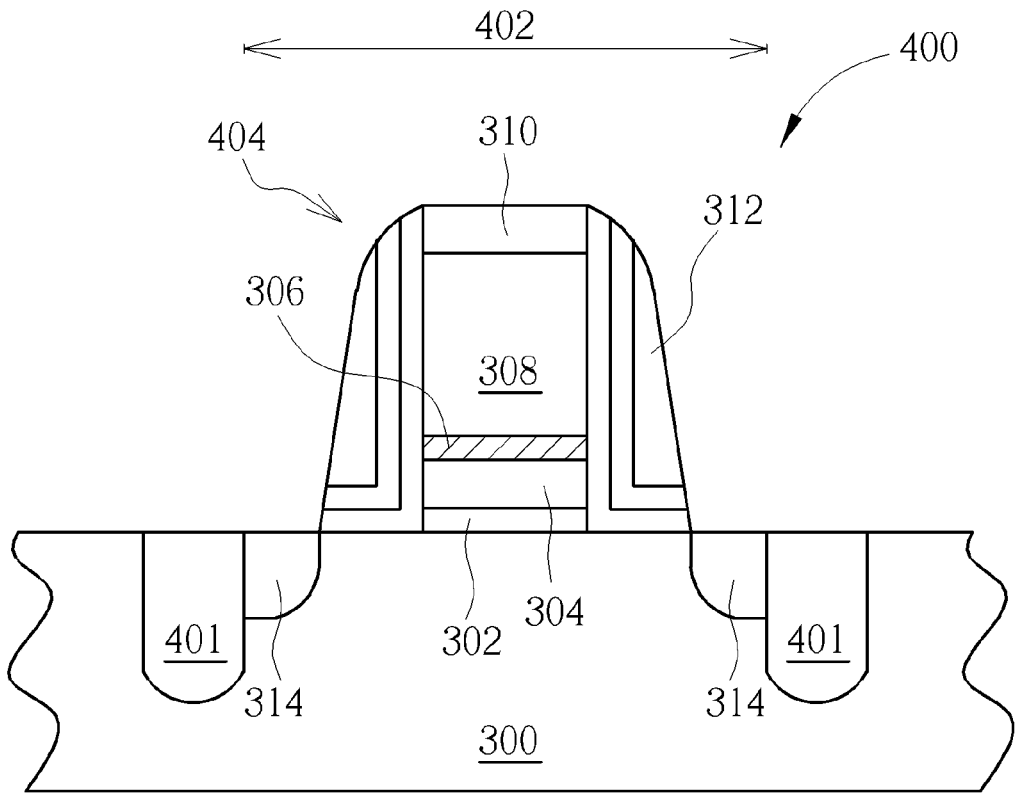

Subsequently, as shown in FIG. 5, a spacer 312 is formed on the sidewall of the gate stack structure 404. The spacer 312 can be a mono-layered structure or a multi-layered structure including high temperature oxide (HTO), SiN, SiO or SiN formed from hexachlorodisilane ($Si_2Cl_6$) (HCD-SiN). The method for forming the sidewall 312 is well known in the art and is not described in detail. Then, an implant process is performed to form a source/drain 314 in the substrate 300 by using the spacer 312 and the gate stack structure 404 as a mask. Then, an annealing process is carried out to activate the source/drain 314, thereby completing the transistor 400. It is noted that the transistor 400 can further include other semiconductor structures which are not explicitly shown in FIG. 5, such as a light doped drain (LDD), a silicide layer, a source/drain having an hexagon (also called sigma $\Sigma$) or octagon shaped cross-section which is formed through selective epitaxial growth (SEG), or other protective films.

Figure 6:
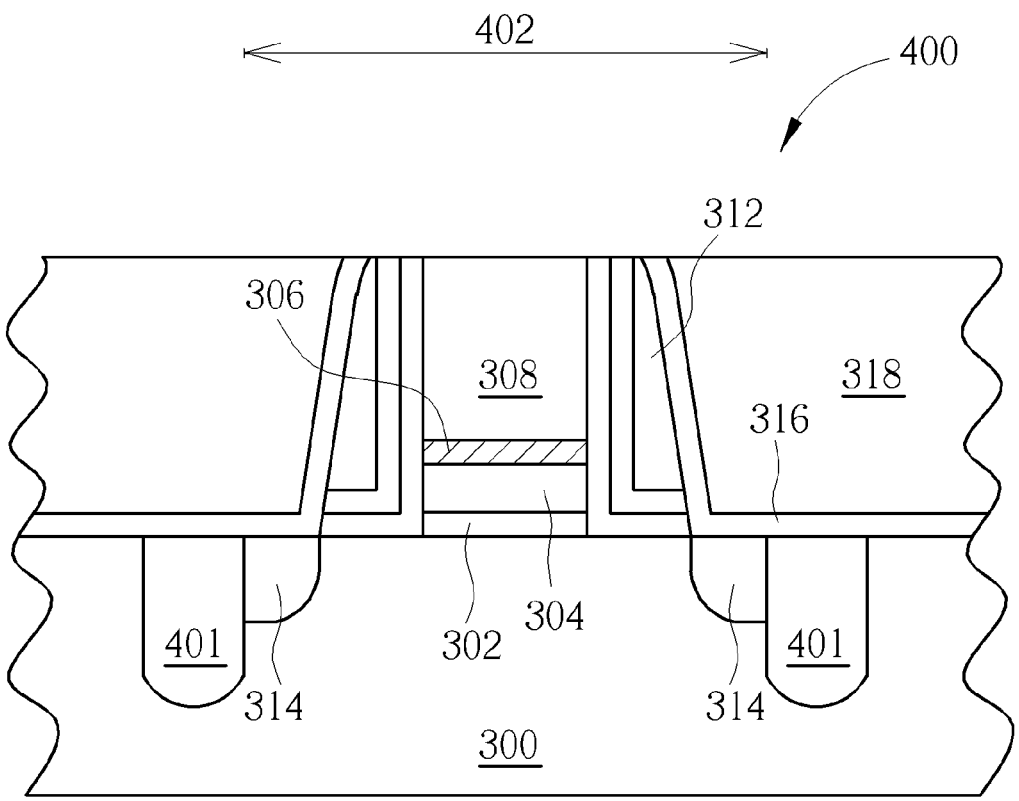

As shown in FIG. 6, after forming the transistor 400, a contact etch stop layer (CESL) 316 and an inter-layer dielectric (ILD) layer 318 are formed on the substrate 300 to cover the transistor 400. In one embodiment, the CESL 316 can generate a stress to form a selective strain scheme (SSS). Then, a planarization process, such as a chemical mechanical polish (CMP) process or an etching-back process is performed to remove a part of the ILD layer 318, a part of the CESL 316, a part of the spacer 312, and completely remove the gate cap layer 310, until the top surface of the gate dummy layer 308 is exposed.

Figure 7:
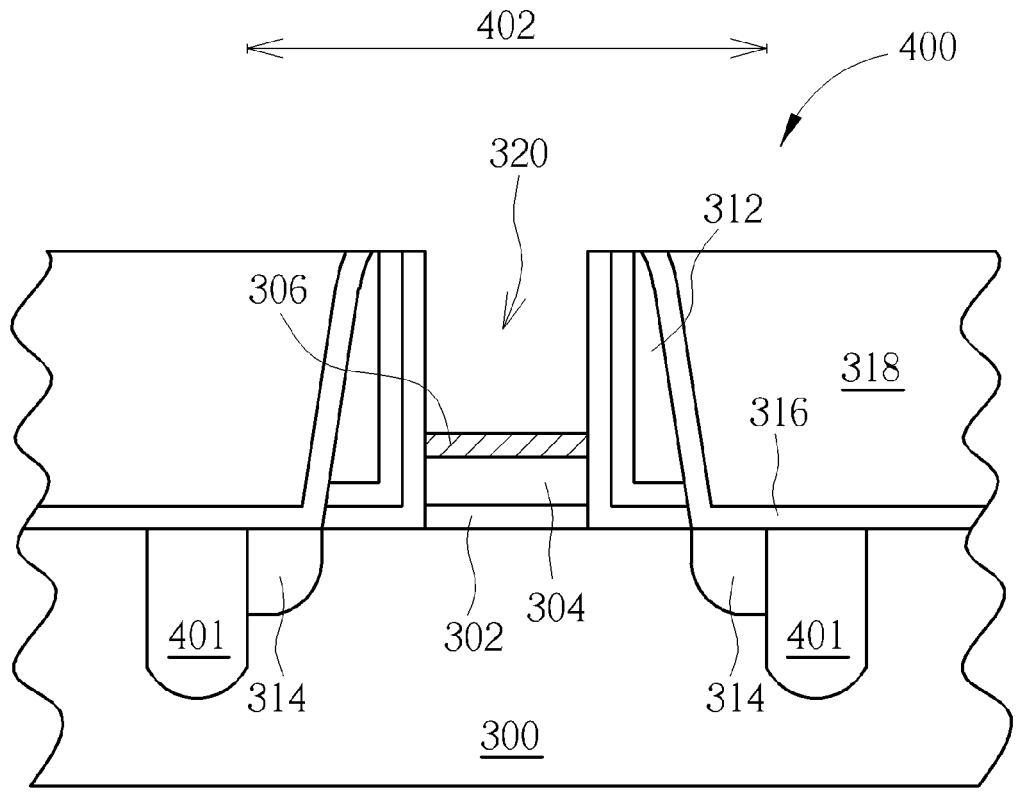

As shown in FIG. 7, the gate dummy layer 308 is removed. The removing method includes a wet etching process, for example, by using a hydroxide solution. Since gate barrier layer 306 containing TiN has a good etching ratio with respect to the gate dummy layer 308 which is made of poly-silicon, the gate barrier layer 306 can act as a good etch stop layer. The etching process toward the gate dummy layer 308 is therefore stopped on the gate barrier layer 306, thereby forming a trench 320 in the transistor 400. In one embodiment, the gate barrier layer 306 can be further removed by a dry etching process for example.

Figure 8:
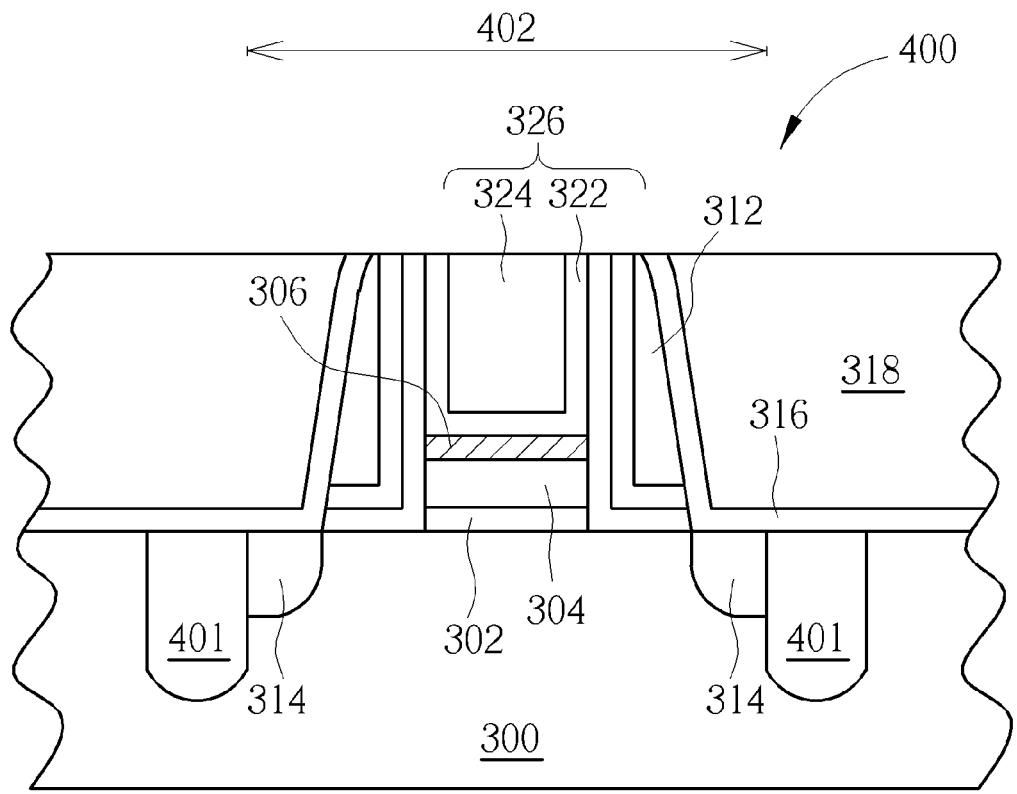

As shown in FIG. 8, according to the conductive type of the transistor 400, appropriate metal is filled into the trench 320 to form a gate metal 326. The metal gate 326 includes a work function metal layer 322 and a metal layer 324. If the transistor 400 is an N-type transistor, the work function metal layer 322 can be TiAl, ZrAl, WAl, TaAl or HfAl, but is not limited thereto. If the transistor 400 is a P type transistor, the work function metal layer 322 can be TiN or TiC, but is not limited thereto. The metal layer 324 can be Al, Ti, Ta, W, Nb, Mo, TiN, TiC, TaN, Ti/W or Ti/TiN, but is not limited thereto.

It is one salient feature of the present invention that the gate barrier layer 306 is a thin layer in order not to greatly influence the work function tuning capability of the metal gate 326. For example, the gate barrier layer 306 is between 10 and 30 angstroms, preferably 20 angstroms, which is relatively thin compared to other layers. Thus, the quality of the gate barrier layer 306 is important. The present invention therefore proposes forming the gate barrier layer 306 at a lower rate to generate a compact and smooth gate barrier layer 306. It can not only avoid the formation of the defects of the gate dummy layer 308 and all the above layers, but also provide good conductivity for the metal gate 326.

In summary, the present invention provides a method for forming a semiconductor structure having a TiN layer and a poly-silicon layer. The TiN in the barrier layer 305 is formed at a low rate so as to obtain a good quality. By doing this, the defects in the TiN layer or the defects on the above layer such as a gate dummy layer or a gate cap layer can be avoided. It is noted that the method of forming the semiconductor structure is not only applied to the above-mentioned embodiment that forms the transistor with a metal gate, but also can be applied to other semiconductor structures that have an interface between a TiN layer and a poly-silicon layer. By the method set forth in the present invention, the semiconductor structure can show good performances.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure having a TiN layer, comprising:
   providing a substrate;
   forming a TiN layer on the substrate at a rate between 0.3 and 0.8 angstrom/second; and
   forming a poly-silicon layer directly on the TiN layer.

2. The method for forming the semiconductor structure according to claim 1, wherein the TiN layer is formed at a rate between 0.4 and 0.6 angstrom/second.

3. The method for forming the semiconductor structure according to claim 1, wherein the TiN layer is formed by a PVD process.

4. The method for forming the semiconductor structure according to claim 3, wherein the PVD process is carried out by using a DC/RF power of 500/600 W.

5. The method for forming the semiconductor structure according to claim 3, wherein the PVD process is carried out by supplying 0/60 sccm of Ar/$N_2$ gas.

6. The method for forming the semiconductor structure according to claim 1, wherein the PVD process is by carried out by supplying 20/40 sccm of Ar/$N_2$ gas.

7. The method for forming the semiconductor structure according to claim 1, wherein the TiN layer is formed by a CVD process.

8. The method for forming the semiconductor structure according to claim 1, wherein the TiN has a thickness substantially between 10 and 30 angstroms.

9. The method for forming the semiconductor structure according to claim 1, wherein the semiconductor structure comprises a MOS.

10. The method for forming the semiconductor structure according to claim 9, wherein the TiN layer is used as a barrier layer of the MOS and the poly-silicon layer is used as a dummy layer of the MOS.

11. The method for forming the semiconductor structure according to claim 1, wherein before forming the TiN layer, further comprising:
    forming a dielectric layer on the substrate, wherein the TiN layer is directly formed on the dielectric layer.

12. The method for forming the semiconductor structure according to claim 11, wherein the dielectric layer has a dielectric constant substantially greater than 20.

13. The method for forming the semiconductor structure according to claim 11, further comprising patterning the poly-silicon layer, the TiN layer and the dielectric layer.

14. The method for forming the semiconductor structure according to claim 13, wherein after the patterning process, the poly-silicon layer on the TiN layer is removed.

* * * * *